United States Patent [19]

Kobayashi

[11] Patent Number: 4,883,775

[45] Date of Patent: Nov. 28, 1989

[54] PROCESS FOR CLEANING AND PROTECTING SEMICONDUCTOR SUBSTRATES

[75] Inventor: Masanori Kobayashi, Meguro, Japan

[73] Assignee: Fujitsu Limited, Kawasaki, Japan

[21] Appl. No.: 131,072

[22] Filed: Dec. 10, 1987

[30] Foreign Application Priority Data

Dec. 17, 1986 [JP] Japan .................. 61-302118

[51] Int. Cl.⁴ .............................. H01L 2/314
[52] U.S. Cl. .................. 437/225; 437/250; 437/946
[58] Field of Search ........... 437/250, 946, 225; 148/DIG. 17

[56] References Cited

U.S. PATENT DOCUMENTS

| | | | |
|---|---|---|---|
| 2,930,722 | 3/1960 | Ligenza | 437/946 X |
| 3,103,733 | 9/1963 | Favro et al. | 437/946 X |
| 3,464,104 | 9/1969 | Tonner et al. | 437/250 |
| 3,577,286 | 5/1971 | Berkenblit et al. | 437/946 X |

FOREIGN PATENT DOCUMENTS

| | | | |
|---|---|---|---|
| 0018427 | 2/1981 | Japan | 437/946 |
| 0017264 | 1/1984 | Japan | 437/227 |
| 0106121 | 6/1984 | Japan | 437/946 |
| 6083333 | 9/1985 | Japan . | |

OTHER PUBLICATIONS

Aspnes et al., Appl. Phys. Lett., V. 46, No. 11, (Jun. 1985), pp. 1071–1073.
IBM Tech. Disc. Bull., V. 27, No. 10A, (Mar. 1985), pp. 5602–5603.

Primary Examiner—Olik Chaudhuri
Attorney, Agent, or Firm—Armstrong, Nikaido, Marmelstein, Kubovcik & Murray

[57] ABSTRACT

A process for the production of semiconductor devices which comprises washing a cleaned semiconductor substrate with or without one or more component parts formed thereon, with pure water, freezing the pure water containing the washed substrate, preserving and/or transporting the ice-covered substrate, and thawing and drying the substrate before a subsequent process. The production process of the present invention can completely remove contamination on a surface of the semiconductor substrate in a wafer process and can stop the formation of a natural oxide coating on a surface of the substrate: Thus shortening and simplifying the wafer process, increasing the quality and yield of the semiconductor devices, and enabling the cleaned substrate to be preserved for a long period and transported to distant areas or far countries.

8 Claims, 6 Drawing Sheets

PROCESS FOR CLEANING AND PROTECTING SEMICONDUCTOR SUBSTRATES

BACKGROUND OF THE INVENTION

1. Field of the Invention

The present invention relates to a process for the production of semiconductor devices. More particularly, the present invention relates to a semiconductor wafer process in which a cleaned substrate with or without one or more component parts formed thereon is preserved in ice made from pure water or purified water after washing with the same water and freezing. The ice-covered substrate can be stably preserved for a long period, and if desired, can be easily and safely conveyed to distant areas or far countries. The present invention can be effectively used in the production of a variety of semiconductor devices such as IC's (integrated circuits), LSI's (large scale integrated circuits), VLSI's (very large scale integrated circuits), and the like. The term "component part" used herein denotes any layer or area in the semiconductor devices, for example, an insulating layer, a protective coating, source and drain areas, a gate electrode area, and other parts found in such devices.

2. Description of the Related Art

In the production of the semiconductor devices described above, one of the most important processes is the cleaning of a semiconductor substrate such as silicon substrate. This is because, any contaminants existing on the cleaned surface of the substrate can adversely affect the characteristics and yields of the resulting devices.

Generally, the cleaning of the semiconductor substrate is carried out in the following basic sequence:

1. Removal of organic substances:
   In order to remove organic contaminants such as oil, wax, fingerprints and resist residues, the substrate is treated with organic solvents, surfactants, acids and alkalis.
2. Removal of oxide coating:
   The substrate is treated with a hydrofluoric acid to remove any remaining oxide coating or natural oxide coating.
3. Removal of particulates and ionic contaminants:
   The substrate is treated with acids to remove particulate contaminants such as metal, oxides and the like, and ions adhered to the substrate surface.
4. Washing with pure water:
   To remove the chemical reagents used in the preceding cleaning steps, and remove any remaining particles, the substrate is thoroughly washed with pure water.
5. Drying:
   As the final cleaning step, the water-washed substrate is dried.

After the drying step, the substrates are generally placed in a "nitrogen box", which is a preservation container filled with clean nitrogen ($N_2$) gas. Preservation must be carried out under stable and safe conditions, but the cleaned substrate still suffers from various contamination problems. For example, since the nitrogen box is frequently opened and closed, the cleaned surface of the substrate can become contaminated with dust, oily and fatty droplets, and the like in the atmospheric air. Further, when the substrate is preserved for a long period in the nitrogen box, oxygen and water vapors in the atmosphere are gradually introduced into the box as a result of opening and closing of the box, and can cause the formation of a coating of natural oxide having different thicknesses on the surface of the substrate. These problems must be solved because of their effect on the process conditions, and the resultant reduced yield of the semiconductor devices and variations in the characteristics thereof.

In addition to contamination, other problems arise due to the transportation of the cleaned substrates. Recently, there is a tendency to build factories for producing semiconductor devices in distant areas and different countries, from the aspect of economy, etc. In such cases, since the cleaned substrates cannot be preserved for a long period, for the reasons described above, these factories must be equipped with large scale units for cleaning and washing the substrates. This is very expensive and, therefore, increased the costs of production of the devices. Further, since each factory is equipped with its own cleaning unit, the substrates with the same structure but from different factories, could not cleaned under the same cleaning conditions. The resultant variations in the cleaning of the devices caused variations in the yields and qualities of the semiconductor devices. Furthermore, when the cleaned substrates are transported to distant areas or far countries for further processing, the substrates are sometimes damaged due to frequent vibration, and therefore, particles distributed thereby on a surface of the substrate must be completely removed, for example, by washing with pure water, before further processing. This additional washing step is time-wasting and expensive.

In order to at least partially resolve the above problems, the cleaned substrates were dipped and retained in pure water for a long period. Unfortunately, a deterioration of the water used due to the action of bacteria and microorganisms caused a contamination of the substrate surface.

It is therefore desired to provide an improved process for the production of semiconductor devices such as IC's, LSI's, and VLSI's, in which the drawbacks of the prior art semiconductor water process are eliminated, particularly in the washing step and the subsequent preserving and/or transporting steps. Namely, provision is desired of an improved preservation method for the cleaned semiconductor substrates by which the substrates can be preserved for a long period and/or transported, without contamination of the substrate surface.

SUMMARY OF THE INVENTION

According to the present invention, there is provided a process for the production of semiconductor devices, comprising the steps of:

washing a cleaned semiconductor substrate with pure water, and keeping said substrate in the pure water, freezing the pure water to cover surfaces of the substrate with pure water ice, preserving and/or transporting the ice-covered substrate, and before the subsequent processing, thawing and drying the ice-covered substrate.

In the production process of the present invention, the semiconductor substrate which may or may not contain one or more component parts formed thereon is subjected to a series of cleaning steps which are conventional in a semiconductor wafer process, for example, acid treatment, alkali treatment, and treatment with an organic solvent. The cleaned substrate is then thoroughly washed with pure water to remove any contaminant particles remaining on the substrate surface. After washing, the substrate is frozen in the pure water used in the washing step or in fresh pure water, to cover the surfaces of the substrate with pure water ice. The cleaned substrate covered with a layer of the pure water ice is preserved in a refrigerator at a temperature lower than a freezing point or icing point of the pure water. If desired, the ice-covered substrate may be transported to any distant area, while maintaining a low temperature sufficient to prevent thawing of the ice layer, for further preservation or processing. Before further processing, the ice-covered substrate is subjected to a thawing step. The thawing step is carried out by, for example, dipping and shaking the ice-covered substrate in fresh pure water. The substrate is then dried and conveyed to the next processing step.

According to the present invention, the substrate washed with pure water is not exposed to air before the next processing, since it is frozen immediately after washing with the pure water and the substrate covered with the layer of pure water ice is maintained in that state until just before the next processing. Covering the cleaned substrate with the layer of the pure water ice completely protects the substrate from contamination and formation of the natural oxide coating, which could not be avoided during preservation and transporting of the substrates in the prior art wafer process, and effectively inhibits any proliferation of bacteria and microorganisms on the substrate surface, which also can cause contamination. Thus, the cleaned surface of the substrates can be retained without deterioration, even when stored for a long time, and the substrates can be transported with a simple packing to distant laboratories and factories for subsequent processing. The present invention, therefore, improves and eases the masking process, reduces production costs of and increases the yield and quality of the devices. In addition, beneficial effects can be obtained as a result of a centralization of the cleaning and washing units at fewer factories from which the cleaned and preserved substrates can be transported to other factories.

BRIEF DESCRIPTION OF THE DRAWINGS

The accompanying drawings illustrate the production process of the present invention in more detail, in which.

DESCRIPTION OF THE PREFERRED EMBODIMENTS

The present invention will be further described with reference to the preferred embodiments thereof.

Figure 1:
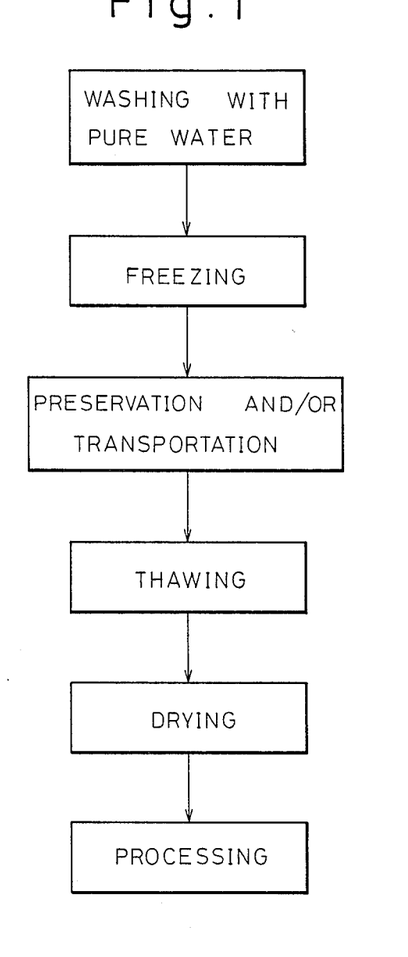
FIG. 1 is a fundamental sequence of the present process from the washing the cleaned substrate with pure water to the processing of the dried substrate.

FIG. 1 illustrates, in sequence, the steps of from washing with pure water to processing in the semiconductor wafer process according to the present invention. The semiconductor substrates to be treated in accordance with the present invention may consist of any semiconductor material conventionally used in the art, for example, silicon and gallium-arsenic. The substrates may or may not contain one or more component parts necessary to complete the semiconductor devices, for example, silicon oxide ($SiO_2$), silicon nitride ($Si_3N_4$), phosphosilicate glass (PGS), and polycrystalline silicon coatings, source and drain areas, and gate electrodes. Namely, according to the present invention, the washing, freezing, storing and/or transporting, thawing, and drying steps can be carried out at any desired stage in the conventional semiconductor wafer process. For example, the washing and other steps can be carried out after production of the semiconductor wafers, after oxidation of the wafers as produced, after deposition of the $Si_3N_4$ coating, and after the formation of the source, drain and gate areas and deposition of the PSG or $Si_3N_4$ coating. However, to enable an easy understanding of the present invention, the washing and other steps will be described hereinafter with reference to the treatment of a silicon wafer, with the exception of FIGS. 4A and 4B which illustrate semi-fabricated semiconductor devices.

In the wafer washing process of FIG. 1, the silicon wafer is first washed with pure water or purified water. The wafer to be washed has been already cleaned in accordance with a conventional cleaning process such as acid, alkali and other treatments to remove from the surface of the wafer a variety of contaminants in the form of ions, particles, and layers such as alkali metal ions, dust or other particles in the atmosphere, resist residues, secretions and other contaminants such a worker's fingerprints, and natural $SiO_2$ coatings and the like. Any type of washing apparatus can be utilized for this washing step. Typical examples of such washing apparatuses include a scrubber, an ultrasonic washing bath, and an overflow-type washing container. Preferably, the overflow-type washing container with running pure water is utilized, since such an apparatus effectively nullifies the effects of the preceding cleaning step using chemicals and will completely remove floating particles and other contaminants from the pure water used for the washing.

The silicon wafer washed with pure water is then frozen in the pure water in a refrigerator or other freezing apparatus. The freezing temperature in this step is not restricted so long as the silicon wafer is completely covered with a layer of pure water ice. The pure water may be that used in the previous washing step or may be fresh pure water. In the latter case, the washed wafer must be carefully conveyed from the pure water for washing to the fresh pure water to ensure that no new contaminants are deposited on the cleaned and washed wafer. The ice-covered silicon wafer is produced as described above.

The ice-covered silicon wafer is preserved at a temperature low enough to maintain an ice covering of the wafer in the same or in a different refrigerator as that used in the freezing step, and under the same or similar conditions, the ice-covered silicon wafer may be transported to different factories in distant areas or far countries, for subsequent processing. Note, since the ice-covered wafer has been cleaned, it is not necessary to provide a special and expensive cleaning and washing unit at the factories to which the wafer is transported. In this step, the cleaned wafer can be preserved for a desired length of time, since the ice-covering thereof protects the wafer from any adverse affects such as contamination and a formation of natural $SiO_2$.

The ice-covered silicon wafer is removed from the refrigerator and then thawed just before the wafer is subjected to the subsequent processing such as etching or oxidation. Thawing can be realized in a conventional manner, for example, by dipping and shaking the wafer in a pure water bath with running water. Since the wafer is now wetted with pure water, it is then dried to remove this water from the surfaces thereof. Drying is preferably carried out in a spin drier. After completion of the drying, the silicon wafer is conveyed to a next station for subsequent processing.

In the practice of the process according to the present invention, commercially available pure water may be used, or if desired, the pure water may be prepared in situ. Further, the pure water may be ion-exchanged water or distilled water. Furthermore, to increase the washing effect, the pure water may be heated to an adequate temperature.

FIGS. 2A to 2E show, in sequence, the steps of washing to drying according to a preferred embodiment of the present invention. In the illustrated wafer process, one silicon wafer sheet is treated.

Figure 2A:
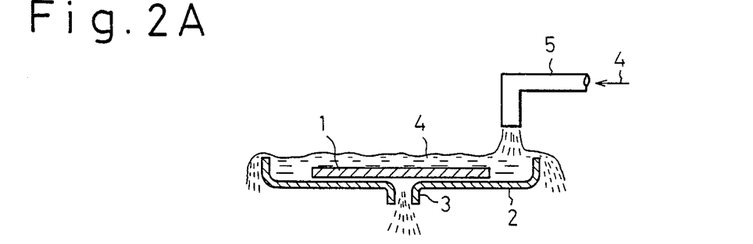
FIGS. 2A to 2E are cross-sectional views showing, in sequence, the washing, freezing, thawing, and drying steps according to a preferred embodiment of the present invention.

In FIG. 2A, a silicon wafer 1, which has been already cleaned in preceding steps, is placed in a pan-like washing container 2. The washing container 2, as described hereinafter, is also used as a storage container. The container 2 is preferably coated with fluoropolymers such as Teflon (trade name for PTFE). Pure water 4 is supplied through a feed pipe 5 to the container 2 and allowed to overflow. The pure water 4 is also discharged from an outlet 3 in the bottom of the container 2. The supply of the pure water 4 and the discharge thereof from the container 2 must be suitably controlled so that, during the washing step, the surface level of the pure water 4 is high enough to immerse all of the wafer 1 in the pure water 4. Further, to avoid damage during washing, the wafer 1 is preferably placed in the container 2 with the principal surface thereof, onto which the component parts are applied, faces upward. Using the illustrated washing apparatus, pure water washing is preferably carried out for about 10 to 20 minutes, although a longer or shorter washing time can be applied. During the washing period, since the wafer 1 is moved freely in the water, both surfaces thereof are completely washed with the pure water 4.

Figure 2B:
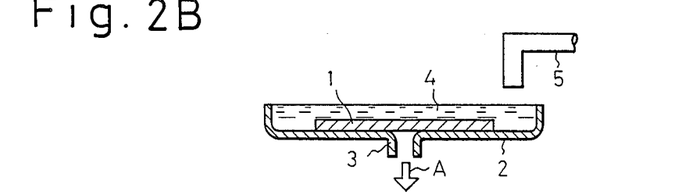

After the washing is completed, as illustrated in FIG. 2B, the supply of pure water 4 from the feed pipe 5 is stopped, and the container 2 is filled with the pure water 4. Thereafter, a vacuum condition is produced and air and water under the wafer 1 is exhausted through the outlet 3, to bring a lower surface of the wafer 1 into tight contact with a bottom surface of the container 2 (the direction of exhaustion is indicated by an arrow A).

Figure 2C:
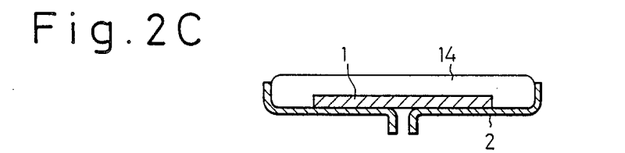

While ensuring that the wafer 1 is completely covered by the pure water 4, the container 2 is placed in a refrigerator, for example, a refrigerator using liquid nitrogen, and the wafer 4 is frozen. The container 2 is cooled to a temperature of from about $-5°$ to $-15°$ C., for example, to freeze the pure water 4. As a result, as shown in FIG. 2C, the wafer 1 is completely covered with a layer 14 of pure water ice. The ice-covered wafer 1 in the container 2 can be stored for a long period in a refrigerator (not shown) maintained at a temperature of about $-10°$ C., for example, and can be transported to other distant factories if desired. Of course, during this transportation, the wafer 1 in the container 2 must remain frozen.

When the wafer 1 is processed in the subsequent processing step, the container 2 with the ice-covered wafer 1 is removed from the refrigerator and is placed in a thawing apparatus. The thawing apparatus used herein is so constructed that fresh pure water 6 is introduced through a feed pipe 8 into a water bath 7 and then allowed to overflow through a discharge pipe 9 (see FIG. 2D). The ice covering 14 of the wafer 1 is immediately thawed by the running pure water 6.

Figure 2D:
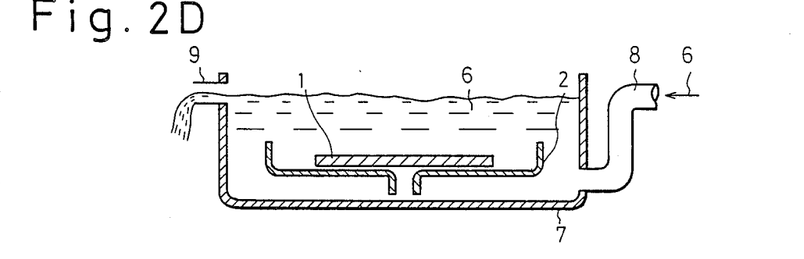
Figure 2E:
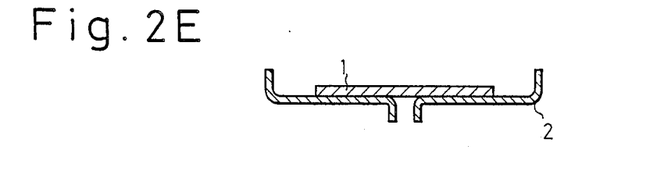

The container 2 with the wafer 1 is then removed from the thawing apparatus, and to remove the pure water adhered to the wafer surface, is dried by a conventional drying process. Drying is carried out under conditions in which the cleaned wafer is protected from contamination and natural oxidation. The dried wafer 1 in the container 2 is shown in FIG. 2E. The wafer 1 is then immediately loaded at a station (not shown) for subsequent processing.

An embodiment of the wafer washing process according to the present invention was described above in detail with regard to the processing of a single silicon wafer sheet. Similarly, according to another preferred embodiment of the present invention, two or more silicon wafer sheets can be batch-wise processed. This embodiment will be described hereinafter with reference to FIGS. 3A to 3D.

Figure 3A:
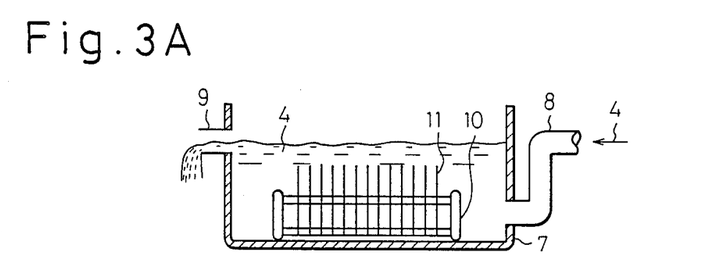
FIGS. 3A to 3D are cross-sectional views showing, in sequence, the washing, freezing, thawing and drying steps according to another preferred embodiment of the present invention.
Figure 3B:
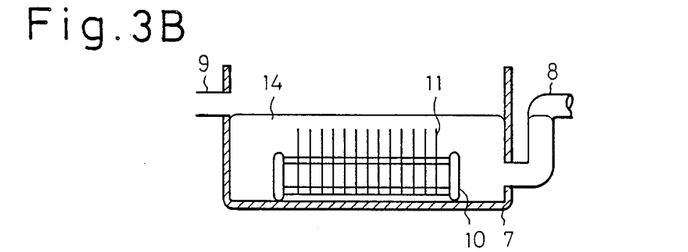

First, as illustrated in FIG. 3A, a set of the cleaned silicon wafers 11 are placed on a supporting jig 10 which is coated with fluoropolymers such as Teflon (trade name for PTFE), and then placed in a washing apparatus. The washing apparatus used herein has the same structure as that of the thawing apparatus (FIG. 2D) used in the above-described first embodiment of the present invention and, therefore, fresh pure water 4 is introduced through a feed pipe 8 into a water bath and then allowed to overflow through a discharge pipe 9. An inner surface of the water bath 7 is coated with a fluoropolymer as used for the supporting jig 10. Then, using the illustrated washing apparatus, pure water washing of the silicon wafers 11 is continued for a predetermined period, for example, about 10 to 20 minutes.

The washed silicon wafers 11 in the water bath 7 are then placed in a refrigerator (not shown), to be frozen. Before this, the supply of the fresh pure water 4 from the feed pipe 8 is stopped, and the wafers 11 are retained on the supporting jig 10. Upon freezing, since the pure water 4 is cooled to a temperature lower than the icing point thereof, the wafers 11 are completely covered and protected with a layer of ice 14 see FIG. 3B). The ice-covered wafers 11, while maintained in the frozen state, can be stored for a long period and/or transported to other locations. During this storing and/or transportation, the wafers 11 are preferably kept in a refrigerator (not shown) which is stably maintained at about −10° C.

Figure 3C:
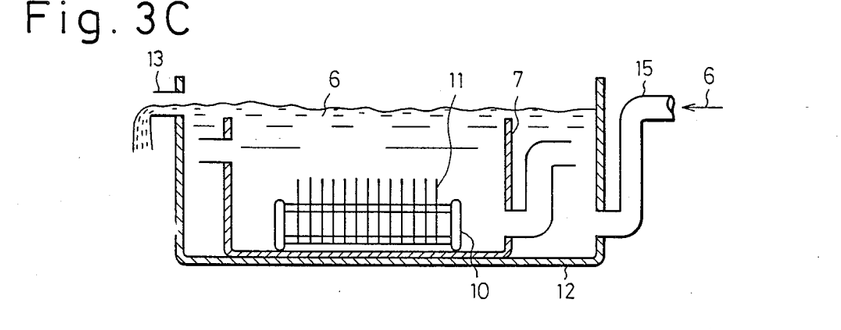

Just before the subsequent processing, the ice-covered wafers 11 are thawed. This thawing can be carried out by using a thawing apparatus as shown in FIG. 3C, for example. In the thawing apparatus of FIG. 3C, fresh pure water 6 is supplied through a feed pipe 15 to a water bath 7 where the running pure water 6 thaws the ice 14 in the water bath 7. The used pure water 6 is then discharged from a discharge pipe 13.

Figure 3D:
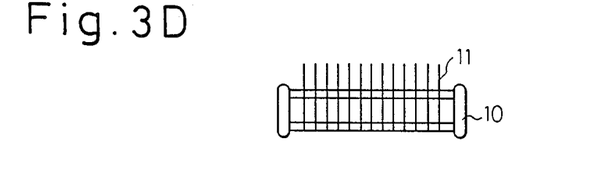

After thawing, the wafers 11 are taken out together with the supporting jig 10 from the water bath 7 and then dried to remove remaining pure water. Drying is preferably carried out in an atmosphere containing an inert gas, such as nitrogen, while avoiding contamination and a formation of a native oxide coating on the cleaned surface of the wafers 11. The dried wafers 11 are shown in FIG. 3D.

After drying is completed, the wafers 11 are subjected to a subsequent processing step. For example, the wafers 11 can be removed, as a set, from the supporting jig 10 and placed on another supporting jig (not shown) for use in the next step. All of the wafers 11 can be simultaneously processed in the subsequent wafer process.

As apparent from the embodiments described above, the semiconductor substrates which were washed with pure water and then frozen and stored in accordance with the present invention, even if stored for a long period and transported, do not suffer from the problems of a formation of a natural oxide coating or contamination of the substrate surface by dust and other particles in the atmosphere, or damage to the substrates during storage and/or transportation, since they are not exposed to the atmospheric air during storage and can not move during transportation. Further, since the substrates are stored at a temperature lower than an icing point of the pure water, the proliferation of bacteria and microorganisms, and thus contamination of the substrate surface caused thereby, can be effectively prevented.

The present invention has been described particularly with reference to the freezing and storing of the semiconductor substrate as produced, i.e., substrates not having other layers, and the resulting notable effects. The inventor also found that the same effects could be obtained in other cases in the wafer and device production processes. For example, the present invention could be applied to the freezing and storing of semi-fabricated semiconductor devices and semiconductor devices as a finished product. Examples of the storage in ice of the semi-fabricated semiconductor devices are shown in FIGS. 4A and 4B.

Figure 4A:
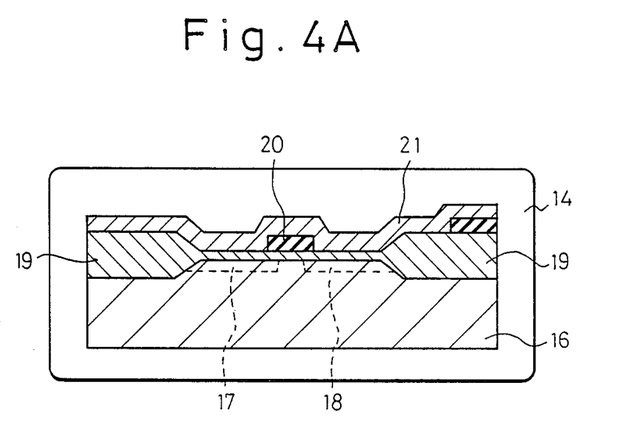
FIGS. 4A and 4B illustrate respectively a cross-sectional view of the semi-fabricated semiconductor device covered with a layer of the pure water ice in accordance with the present invention, for preservation and transportation.

FIG. 4A shows a cross-section of a semi-fabricated typical MOS (metal oxide semiconductor) IC covered with ice. In FIG. 4A, a p-type silicon substrate 16 has formed thereon, in sequence, a field silicon oxide coating 19, a polycrystalline silicon gate 20, and a PSG coating 21. Reference numerals 17 and 18 indicate source and drain areas formed after the polycrystalline gate 20 was deposited and etched. As illustrated, the device is covered with a layer 14 of pure water ice and, therefore, the ice-covered device can be stored and transported without problems if maintained at a temperature lower than an icing point of the pure water. The ice-covered device is thawed and dried just before wiring. Thereafter, without further washing or cleaning, contact holes are opened and metal coatings for wiring are then formed.

Figure 4B:
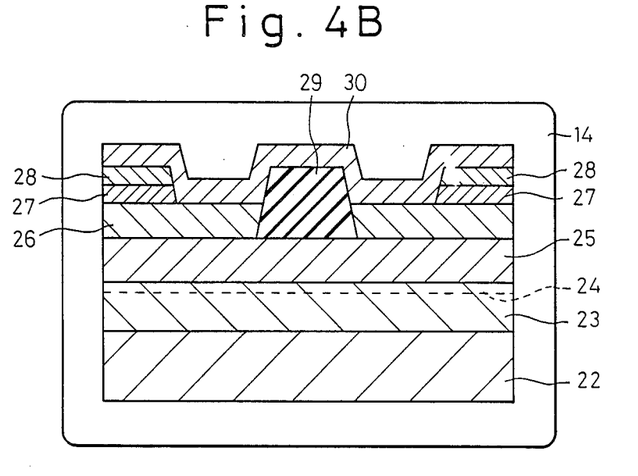

FIG. 4B shows a cross-section of a semi-fabricated typical HEMT (high electron mobility transistor) covered with ice. A (100)-oriented semiinsulating GaAs substrate 22 has, in sequence, an undoped GaAs layer 23, a 2DEG (two-dimensional electron gas) layer 24, and an n-$Al_xGa_{1-x}As$ layer 25. A gate electrode 29 of Ti/Pt/Au is formed on the n-$Al_xGa_{1-x}As$ layer 25, and an n-GaAs layer 26 is also formed on the n-$Al_xGa_{1-x}As$ layer 25. Source and drain areas, each consisting of an Au/Ge layer 27 and an Au layer 28, are formed on the n-GaAs layer 26. An $SiO_2$ layer 30 is deposited as an insulating layer over the gate electrode 29 and the source and drain areas 27/28. The semi-fabricated device is then covered with a layer 14 of pure water ice. The ice-covered device can be stored for a long period and, if necessary, can be transported. The ice covering the device is thawed just before the subsequent processing of the device, i.e., the device is thawed and dried before the next processing thereof. The dried device is immediately subjected to the intended processing, for example, forming contact holes and wiring.

According to the present invention, the formation of natural oxide coatings and the adhesion of contaminant particles on the cleaned surface of the substrates during storing for a long period can be effectively prevented. These important effects of the present invention will be now demonstrated with reference to FIGS. 5A to 5C and FIG. 6.

A commercially available pre-cleaned (100)-oriented silicon wafer having a diameter of 4 inches was used as the sample to be tested. All of the wafer samples were washed with pure water in the washing apparatus of FIG. 2A. The washing time was about 15 minutes. The washed samples were then dried in a nitrogen atmosphere. The first washed and dried silicon wafer was labeled "Sample A". A second silicon wafer, labeled "Sample B", was washed, frozen, and preserved for one month as illustrated in the sequence shown in FIGS. 2A, 2B and 2C. After one month, the ice covered silicon wafer sample B was thawed and dried as shown in FIGS. 2D and 2E. A third silicon wafer, labeled "Sample C", was washed and dried in the same way as in the preparation of sample A. This sample C was then placed in a clean plastic box and left to stand for one month in the atmosphere.

The silicon wafer samples A, B, and C were examined to determine the amount of growth of the natural $SiO_2$ coating and the distribution of fine particles having a diameter of 0.3 μm and more. First, for each of the samples A, B and C, the thickness of the natural $SiO_2$ coating was optically determined. The results were plotted with white circles in FIG. 6 and indicate that, according to the present invention, the formation of the natural $SiO_2$ coating can be effectively inhibited. Further, it should be noted that, even if the ice-covered silicon wafer of the present invention is additionally preserved for two or more months, no growth of the natural $SiO_2$ coating occurs, since the ice surrounding the silicon wafer acts as a barrier to the introduction of the oxygen which is essential to the formation of such a coating.

Figure 5A:
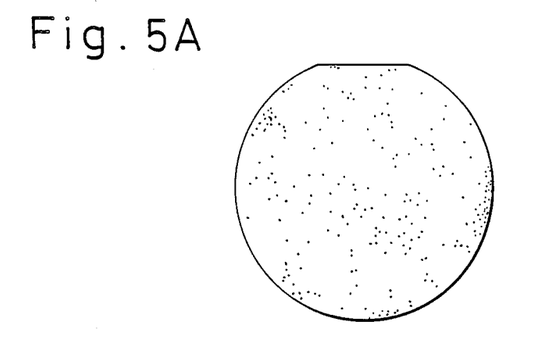
FIGS. 5A, 5B and 5C are map illustrations showing a distribution of contaminant particles on three different silicon wafers; and, FIG. 6 is a graph plotting the thickness of the natural oxide coating and the number of contaminant particles on the silicon wafers of FIGS. 5A, 5B, and 5C.
Figure 5B:
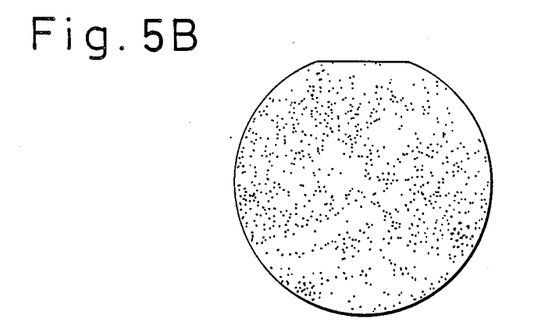
Figure 5C:
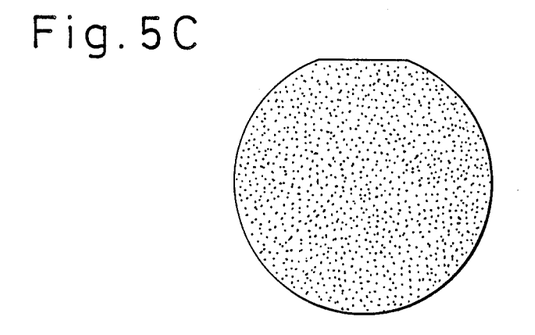
Figure 6:
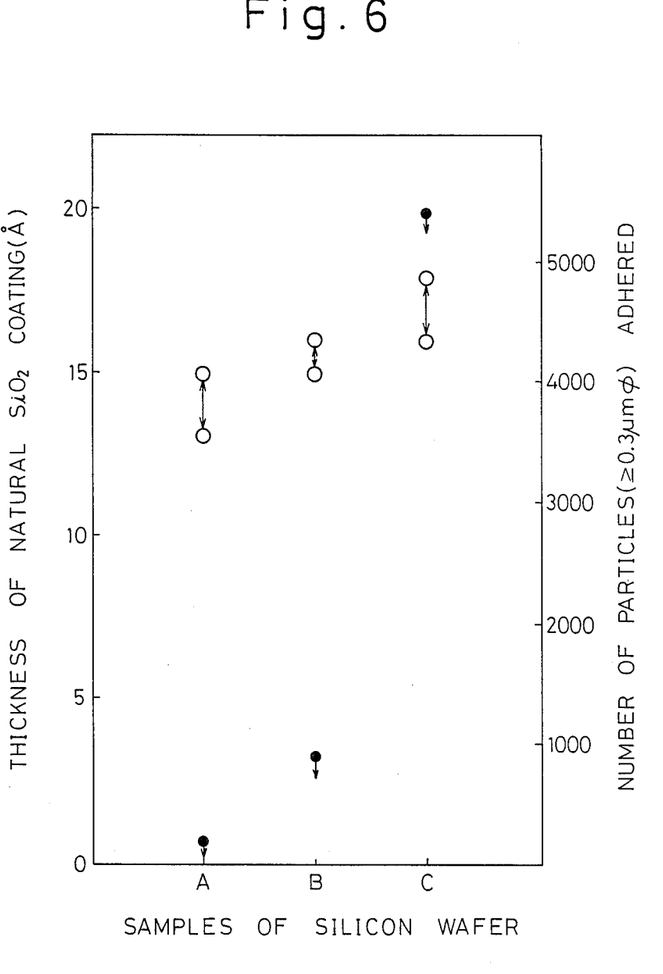

Second, each of the samples A, B, and C was irradiated with a laser beam to cause light scattering. The scattered light was detected to analyze the distribution of particles on the wafer surface. After data processing, the map illustrations of FIGS. 5A, 5B and 5C showing the distribution of the adhered particles and a graph of FIG. 6 showing the number of adhered particles (cf. black circles) were obtained. FIGS. 5A, 5B, and 5C correspond to the wafer samples A, B, and C, respectively. These map illustrations indicate that, when the cleaned wafer was frozen and preserved in accordance with the present invention, the adhesion of the particles was notably diminished in comparison with the cleaned wafer having no ice covering and left to stand in the atmosphere. This is also supported by the data of the number of the adhered particles appearing in FIG. 6. In this connection, it should be noted that, in wafer sample B, the number of the particles would be further reduced if the freezing step was carried out in situ immediately after the wafer sample was washed with the pure water. This is because the washing and freezing must be carried out at different and distant locations and, in actuality, the washed wafer sample was carried in a container filled with pure water.

I claim:

1. A process for cleaning and protecting semiconductor substrates, comprising the steps of:

washing a cleaned semiconductor substrate with pure water, while keeping said substrate in the pure water, freezing the pure water to cover surfaces of the substrate with ice, said freezing being continuously carried out by keeping said substrate submerged in the pure water without exposing said substrate to the atmosphere during the period between the washing step and the freezing step, preserving and/or transporting the ice-covered substrate, just before a subsequent processing, thawing and drying the ice-covered substrate.

2. A process according to claim 1, in which the semiconductor substrate is a silicon substrate.

3. A process according to claim 1, in which the semiconductor substrate is a gallium-arsenic substrate.

4. A process according to claim 1, in which a series of washing, freezing, preserving and/or transporting, and thawing and drying steps is carried out subsequent to cleaning steps in a wafer process.

5. A process according to claim 4, in which no circuit elements necessary to complete a semiconductor device have been formed on the substrate at the time of the cleaning steps.

6. A process according to claim 4, in which one or more circuit elements necessary to complete a semiconductor device have been formed on the substrate at the time of the cleaning steps.

7. A process according to claim 1, in which the semiconductor substrate is washed with pure water using an overflow-type washing container with running water.

8. A process according to claim 7, in which the washed substrate is kept in a frozen state in the pure water in the container used in the washing step, and the resulting ice-covered substrate is preserved in situ and/or transported to other locations.

* * * * *